(12) United States Patent
Darsey et al.

(10) Patent No.: US 7,781,756 B2
(45) Date of Patent: Aug. 24, 2010

(54) NANOTUBE-PORPHYRIN MOLECULAR STRUCTURE AND APPLICATIONS OF SAME

(75) Inventors: Jerry A. Darsey, Little Rock, AR (US); Dan Alexander Buzatu, Little Rock, AR (US); Freddy Nguyen, Urbana, IL (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 774 days.

(21) Appl. No.: 11/225,371

(22) Filed: Sep. 13, 2005

(65) Prior Publication Data

US 2008/0017847 A1 Jan. 24, 2008

Related U.S. Application Data

(60) Provisional application No. 60/609,506, filed on Sep. 13, 2004.

(51) Int. Cl.
*H01L 51/00* (2006.01)
*D01F 9/12* (2006.01)
*B82B 1/00* (2006.01)

(52) U.S. Cl. ............... 257/40; 257/E51.04; 423/447.1; 423/445 B; 438/99; 977/744; 977/846

(58) Field of Classification Search ......... 977/742–753, 977/842–848; 442/349, 354; 423/447.1–447.9, 423/445 B; 257/40, 613, E51.038–E51.041; 438/99
See application file for complete search history.

(56) References Cited

U.S. PATENT DOCUMENTS 6,641,793 B2 * 11/2003 Haddon et al. ........... 423/447.2

(Continued)

FOREIGN PATENT DOCUMENTS

JP 2006143562 A * 6/2006

(Continued)

OTHER PUBLICATIONS

Kim, Y., et al. "A New Route to Organic Nanotubes from Porphyrin Dendrimers." Angew. Chem., vol. 115, No. 10 (2003): pp. 1153-1158.*

(Continued)

*Primary Examiner*—Matthew W Such
(74) *Attorney, Agent, or Firm*—Morris, Manning & Martin, LLP; Tim Tingkang Xia (57) ABSTRACT

A molecular structure. In one embodiment, the molecular structure includes a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and a porphyrin molecule having a plurality of carbon atoms and a first plurality of hydrogen atoms, wherein at its original state the porphyrin molecule has a plurality of pyrrole units and each pyrrole unit is coupled to another pyrrole unit through a methine bridge so as to form a ring structure with a second plurality of hydrogen atoms positioned peripherally along the ring structure. The porphyrin molecule is chemically coupled to the interior surface of the nanotube such that at least one of the second plurality of hydrogen atoms positioned peripherally along the ring structure is replaced by a carbon atom of the nanotube.

19 Claims, 7 Drawing Sheets

U.S. PATENT DOCUMENTS

| | | | |
|---|---|---|---|
| 7,132,163 B1 * | 11/2006 | Shelnutt et al. | 428/402 |
| 7,250,147 B2 * | 7/2007 | Tour et al. | 423/447.1 |
| 7,374,685 B2 * | 5/2008 | Sun | 210/639 |
| 2005/0053542 A1 * | 3/2005 | Harutyunyan | 423/447.3 |
| 2007/0003471 A1 * | 1/2007 | Kawabata | 423/447.3 |

FOREIGN PATENT DOCUMENTS

| | | | |
|---|---|---|---|
| WO | WO 2004087570 A1 * | 10/2004 | |

OTHER PUBLICATIONS

Biesaga, M., et al. "Porphyrins in Analytical Chemistry. A Review." Tanlanta, vol. 51 (2000): pp. 209-224.*

Schwab, A.D., et al. "Porphyrin Nanorods." J. Phys. Chem. B, vol. 107 (2003): pp. 11339-11345.*

Li, H., et al. "Single-Walled Carbon Nanotubes Tethered with Porphyrins: Synthesis and Photophysical Properties." Adv. Mater., vol. 16, No. 11 (Jun. 4, 2004): pp. 896-900.*

Kataura, H., et al. "Optical Properties of Fullerene and Non-Fullerene Peapods." Appl. Phys. A: Mat. Sci. Proc., vol. 74, No. 3 (Mar. 4, 2002): pp. 349-354.*

E. Lerner, "Putting Nanotubes to Work," *The Industrial Physicist*, American Institute of Physics, pp. 22-25 (Dec. 1999).

H. Postma et al., Carbon Nanotube Single-Electron Transistors at Room Temperature *Science* 293, pp. 76-79 (2001).

P. A. Liddell et al., "Photoinduced Charge Separation and Charge Recombination to a Triplet State in a Carotene—Porphyrin—Fullerene Triad," *J. Am. Chem. Soc.* 119, pp. 1400-1405 (1997).

D. Kuciauskas et al., "Magnetic Switching of Charge Separation Lifetimes in Artificial Photosynthetic Reaction Centers," *J. Am. Chem. Soc.* 120, pp. 10880-10886 (1998).

S. Iijima et al., "Helical Microtubules of Graphitic Carbon," *Nature* 354, pp. 56-58 (1991).

* cited by examiner

NANOTUBE-PORPHYRIN MOLECULAR STRUCTURE AND APPLICATIONS OF SAME

CROSS-REFERENCE TO RELATED PATENT APPLICATION

This application claims the benefit, pursuant to 35 U.S.C. §119(e), of U.S. provisional patent application Ser. No. 60/609,506, filed on Sep. 13, 2004, entitled "Nanotube-Porphyrin Molecule, Compounds and Applications of Same," by Jerry A. Darsey, Dan A. Buzatu, and Freddy Nguyen, which is incorporated herein by reference in its entirety.

One or more references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present invention is generally related to the field of nanostructures, and in particular, is related to a nanotubes-porphyrin molecular structure and applications of same.

BACKGROUND OF THE INVENTION

Electronic integrated circuits constituting digital electronic systems have continuously been shrinking in size since 1960s, and scientists and engineers are expected to carry on the trend of miniaturization of the integrated circuits. However, the laws of quantum mechanics and the limitations of fabrication techniques may soon prevent further reduction in the size of current conventional integrated circuits. For example, a typical process for fabricating an integrated circuit chip is to stencil the pattern of microscopic components of the chip onto silicon with the help of an ultraviolet light, which works fine for the components sized down to about 300 nanometers. However, it may become unfeasible for the components sized below about 100 nanometers.

In order to continue the miniaturization of circuit elements down to the nanometer scale, perhaps even to the molecular scale, researchers are investigating several alternatives to the conventional circuit elements. Among them, one is to design compounds that can function as logic gates, which are basic building blocks of electronic integrated circuits. The incentive for such effort is that molecules are naturally occurring nanometer-scale structures, and can be synthesized identically, inexpensively, and easily. Examples of molecular logic to date are comprised of compounds that undergo photo-induced reversible structural changes or supramolecular ionic binding upon exposure to external stimuli to elicit responses similar to logic operations. These molecular-scale logic gates may lead to the replacement of their electronic predecessors.

Figure 1:
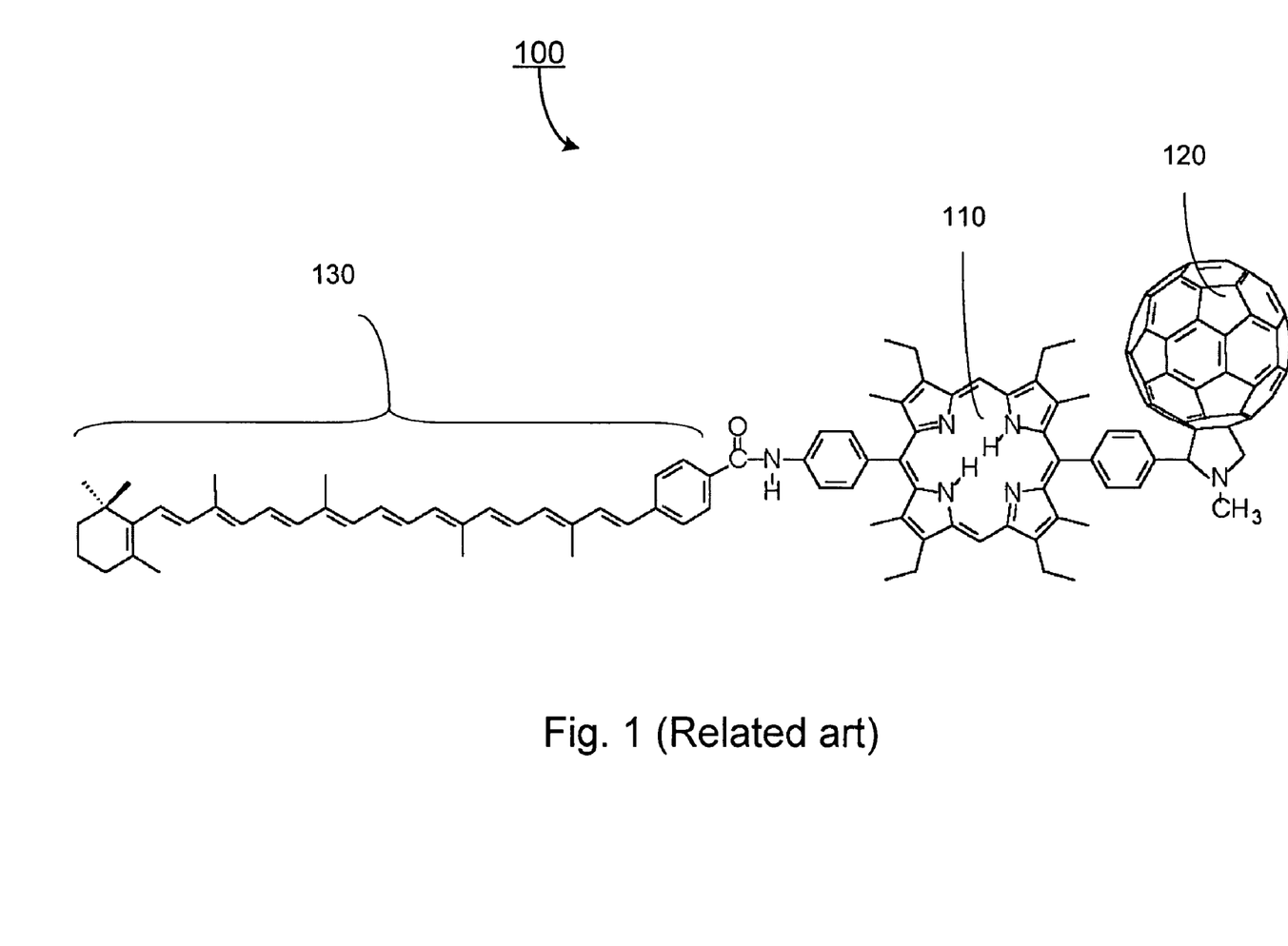
FIG. 1 shows a molecule having a synthetic porphyrin covalently linked to both a fullerene and a carotenoid polyene in related art.

An exemplary compound that may be applied in the molecular electronics is shown in FIG. 1. A molecular triad 100 includes a synthetic porphyrin 110 covalently linked to both a fullerene 120 and a carotenoid polyene 130, for which one may see more detailed discussion in P. A. Liddell, et al. *J. Am. Chem. Soc.* 1997, 119, 1400-1405. When the porphyrin 110 absorbs light, it donates an electron to the fullerene 120. The carotenoid polyene 130 then transfers an electron to the porphyrin 110 to give a final charge-separated state. This state has a relatively long lifetime, and stores a considerable fraction of the light energy as electrochemical potential energy. This conversion of light energy to electrochemical potential is analogous to the way of which plants carry out solar energy harvesting during photosynthesis. The triad 100 is corresponding to a molecular-scale photovoltaic cell, and may function as a molecular-scale AND logic gate.

Figure 2:
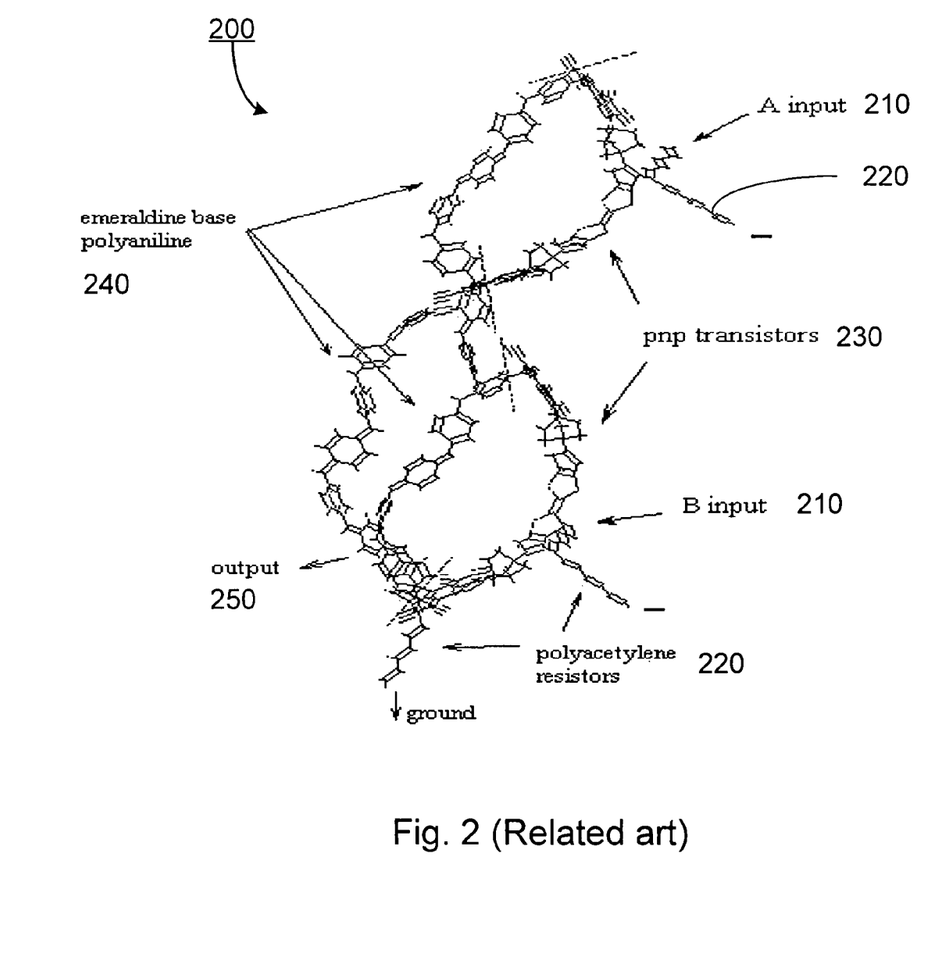
FIG. 2 shows a molecular logic circuit in related art.
Figure 3:
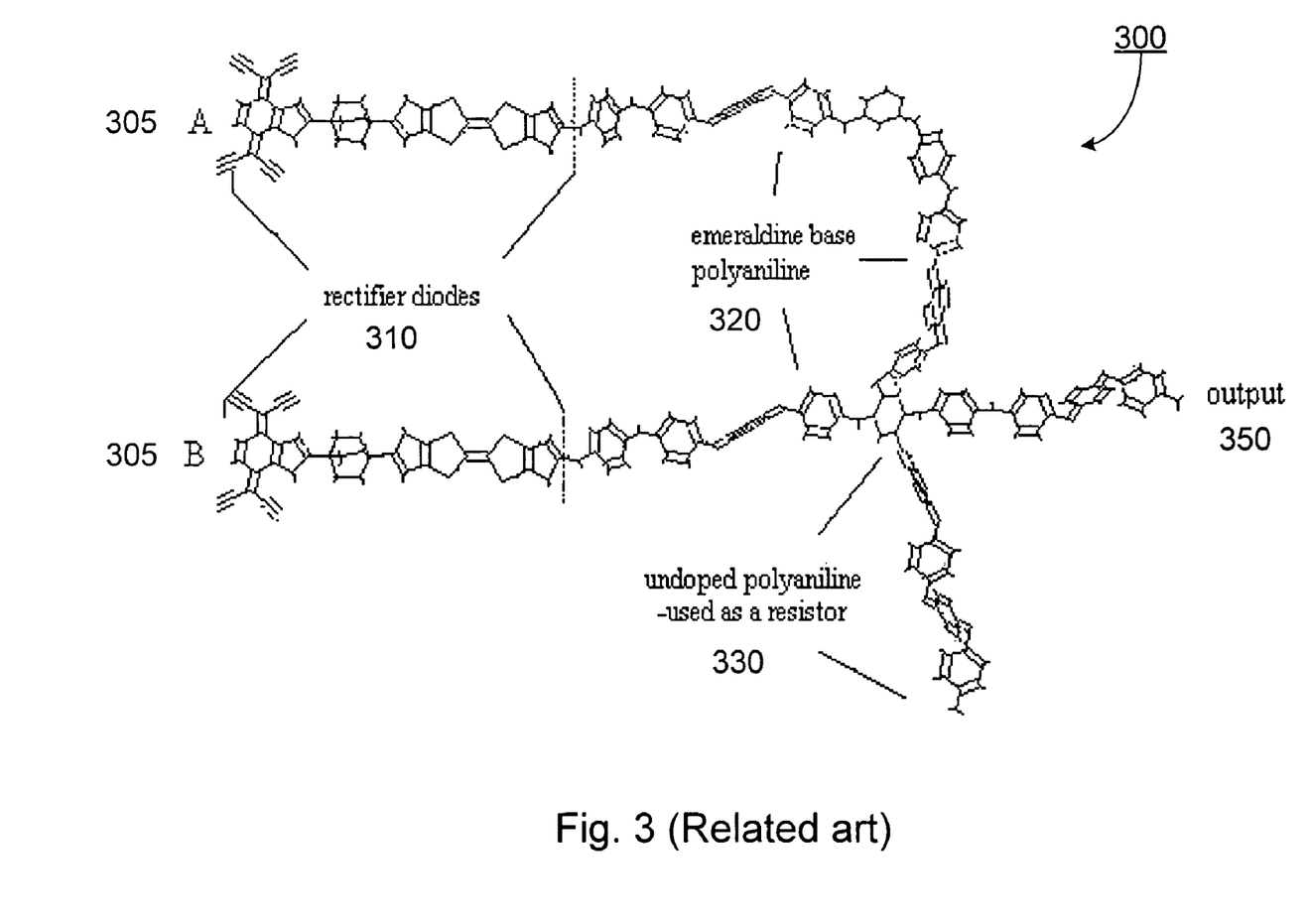
FIG. 3 shows a molecular logic circuit in related art.

FIGS. 2 and 3 show molecular implementations of AND and OR logic circuits, respectively. As shown in FIG. 2, molecular AND logic circuit 200 has two input ports 210, input A and input B, which are connected to two polyacetylene resistors 220, respectively. The circuit 200 also has two PNP-type transistors 230. Each transistor 230 is formed with a tetracyanoquinodimethane (hereinafter "TCNQ") and a tetrathiafulvalene (hereinafter "TTF"). Emeraldine base polyaniline 240 serves as wires to connect these components. The circuit 200 is capable of performing a logic AND function to produce a desired signal through an output port 250, in response to input signals from the two input ports 210, input A and input B.

Now referring to FIG. 3, OR circuit 300 includes rectifier diodes 310 that are formed with TCNQ and TTF, two input ports 305, A and B, which are coupled with the rectifier diodes 310, and an output port 350. Emeraldine base polyaniline 320 serves as wires to connect the diodes 310 to polyacetylene resistors 330, respectively.

In addition, nanotubes have high thermal conductivity and are stable at high temperatures, E. Lerner, *The Industrial Physicist*, December 1999, 22-25, and capable of carrying higher currents than either copper or superconductors. Nanotubes could become an important component in the molecular electronics. For example, a room-temperature single-electron transistor (SET) within a single carbon nanotube has been reported, H. W. C. Postma, et al., *Science*, 2001, 293, p. 76, which can be switched between state of "on" and state of "off" with a single electron and works efficiently at room temperature.

However, challenges are to devise molecular structures that act as electrical components, and to combine these molecular structures into a more complex circuit structure needed for digital electronic systems.

Therefore, a heretofore unaddressed need exists in the art to address the aforementioned deficiencies and inadequacies.

SUMMARY OF THE INVENTION

The present invention, in one aspect, relates to a molecular structure. In one embodiment, the molecular structure includes a nanotube formed with a plurality of carbon atoms and having a first end, an opposite, second end, and a body portion defined therebetween, where the body portion has an interior surface defining a cavity, an opposite, exterior surface and a longitudinal axis therethrough the cavity. In one embodiment, the nanotube comprises one of a conducting nanotube and a semiconducting nanotube, where each can be a single wall nanotube or a multiwall nanotube.

The molecular structure further includes a porphyrin molecule having a plurality of carbon atoms and a first plurality of hydrogen atoms. At its original state, the porphyrin molecule has a plurality of pyrrole units and each pyrrole unit is coupled to another pyrrole unit through a methine bridge so as to form a ring structure with a second plurality of hydrogen atoms positioned peripherally along the ring structure. In the embodiments of the present invention, the porphyrin molecule is chemically coupled to the interior surface of the nanotube such that at least one of the second plurality of hydrogen atoms positioned peripherally along the ring structure is replaced by a carbon atom of the nanotube, where the carbon atom of the nanotube forms a covalent bond with a corresponding carbon atom of the porphyrin molecule. In one embodiment, the number of the second plurality of hydrogen atoms is not smaller than the number of the first plurality of hydrogen atoms. The porphyrin molecule further has a plurality of pyrrole nitrogens positioned interiorly on the ring structure and coordinated to a metal ion, where the metal ion comprises an element ranging from an element with atomic number 3 (Li) to an element with atomic number 85 (At), excluding elements in VIIIA of the periodic table. In one embodiment, the metal ion comprises zinc.

In another aspect, the present invention relates to a process of synthesizing a nanotube-porphyrin molecular structure. In one embodiment, the process includes the steps of forming a nanotube with a plurality of carbon atoms having a first end, an opposite, second end, and a body portion defined therebetween, wherein the body portion has an interior surface defining a cavity, an opposite, exterior surface and a longitudinal axis therethrough the cavity, and chemically coupling a porphyrin molecule having a plurality of carbon atoms and a first plurality of hydrogen atoms to the interior surface of the nanotube, wherein at its original state the porphyrin molecule has a plurality of pyrrole units and each pyrrole unit is coupled to another pyrrole unit through a methine bridge so as to form a ring structure with a second plurality of hydrogen atoms positioned peripherally along the ring structure, and wherein the porphyrin molecule is coupled such that at least one of the second plurality of hydrogen atoms is replaced by a carbon atom of the nanotube. In one embodiment, the carbon atom of the nanotube forms a covalent bond with a corresponding carbon atom of the porphyrin molecule.

In yet another aspect, the present invention relates to a logic gate for use in an electronic circuit. In one embodiment, the logic gate has a plurality of nanotube-porphyrin molecular structures forming an array that is capable of performing a logical operation responsive to a signal. Each nanotube-porphyrin molecular structure comprises a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and a porphyrin molecule having a plurality of carbon atoms and a first plurality of hydrogen atoms, wherein at its original state the porphyrin molecule has a plurality of pyrrole units and each pyrrole unit is coupled to another pyrrole unit through a methine bridge so as to form a ring structure with a second plurality of hydrogen atoms positioned peripherally along the ring structure. The porphyrin molecule is chemically coupled to the interior surface of the nanotube such that at least one of the second plurality of hydrogen atoms positioned peripherally along the ring structure is replaced by a carbon atom of the nanotube, wherein the carbon atom of the nanotube forms a covalent bond with a corresponding carbon atom of the porphyrin molecule.

The logical operation comprises an AND operation, an OR operation, a NOT operation, or a combination thereof. In one embodiment, the signal comprises a signal related to one of an electric field, a magnetic field, an electromagnetic field, and a combination thereof. For example, the signal can be an electronic signal. Alternatively, the signal can be a photonic signal.

In a further aspect, the present invention relates to a photovoltaic device for producing an electronic signal when exposed to a radiant energy. In one embodiment, the photovoltaic device includes a plurality of nanotube-porphyrin molecular structures forming an array that is capable of producing an electronic signal responsive to the radiant energy, and a processor coupled to the array of the plurality of nanotube-porphyrin molecular structures for outputting the produced electronic signal. Each nanotube-porphyrin molecular structure comprises a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and a porphyrin molecule having a plurality of carbon atoms and a first plurality of hydrogen atoms, wherein at its original state the porphyrin molecule has a plurality of pyrrole units and each pyrrole unit is coupled to another pyrrole unit through a methine bridge so as to form a ring structure with a second plurality of hydrogen atoms positioned peripherally along the ring structure. The porphyrin molecule is chemically coupled to the interior surface of the nanotube such that at least one of the second plurality of hydrogen atoms positioned peripherally along the ring structure is replaced by a carbon atom of the nanotube, wherein the carbon atom of the nanotube forms a covalent bond with a corresponding carbon atom of the porphyrin molecule. The output electronic signal is in the form of one of voltage and current. In one embodiment, the radiant energy comprises photons.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 4 shows a nanotube-porphyrin molecule structure according to one embodiment of the present invention: (a) a molecular structure, and (b) a schematic of FIG. 4(a).

FIG. 5 shows a single-wall carbon nanotube: (a) a side view, (b) a perspective view, and (c) a side view with characteristic coordinators.

FIG. 6 shows a porphyrin molecule: (a) in a free base state, and (b) in a state containing a metal ion.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings of FIGS. 4-6. In accordance with the purposes of this invention, as embodied and broadly described herein, this invention, in one aspect, relates to a molecular structure having a nanotube and a porphyrin molecule coupled with the nanotube such that the molecular structure is capable of performing logic functions responsive to a signal.

Figure 4A:
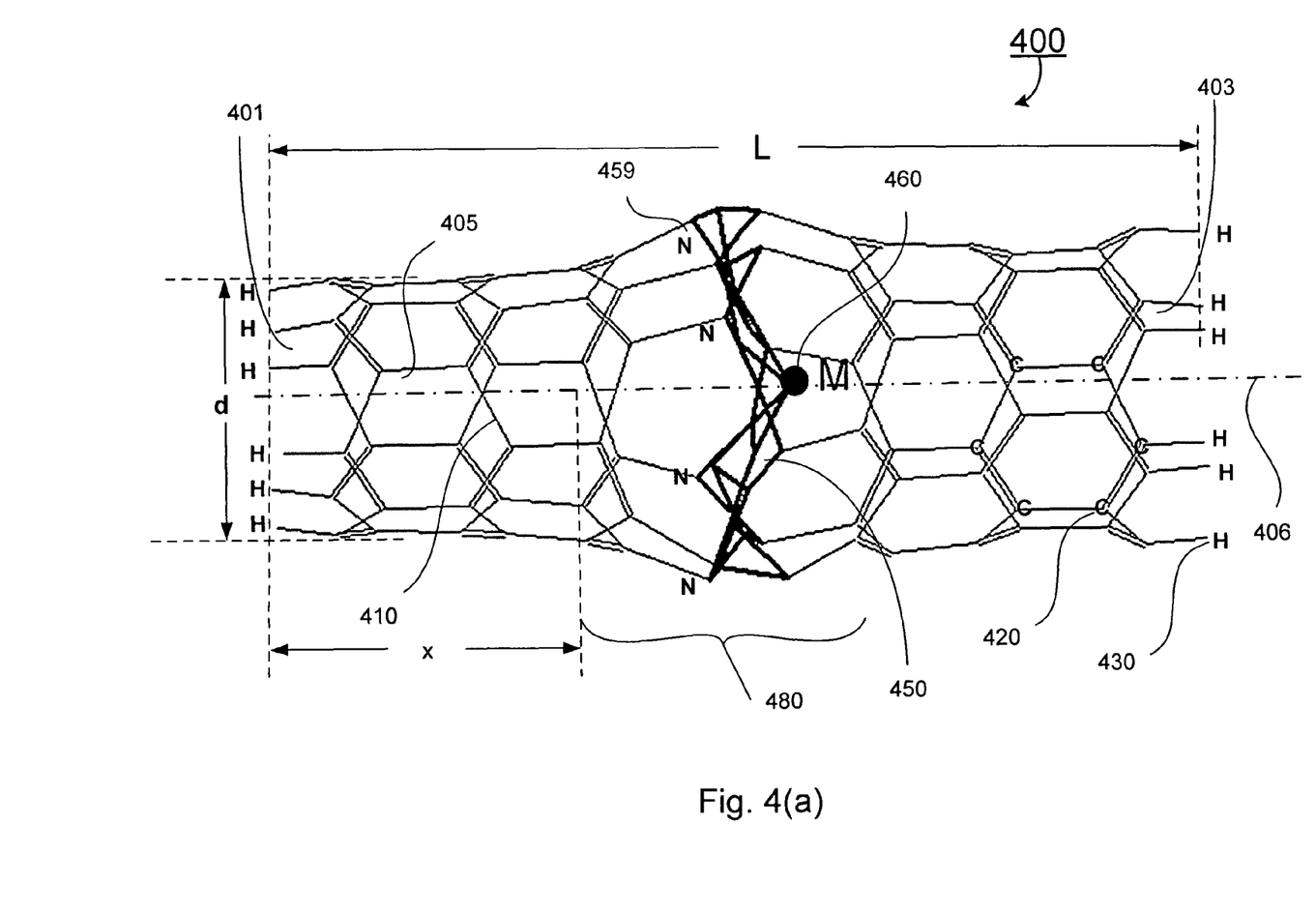
Figure 4B:
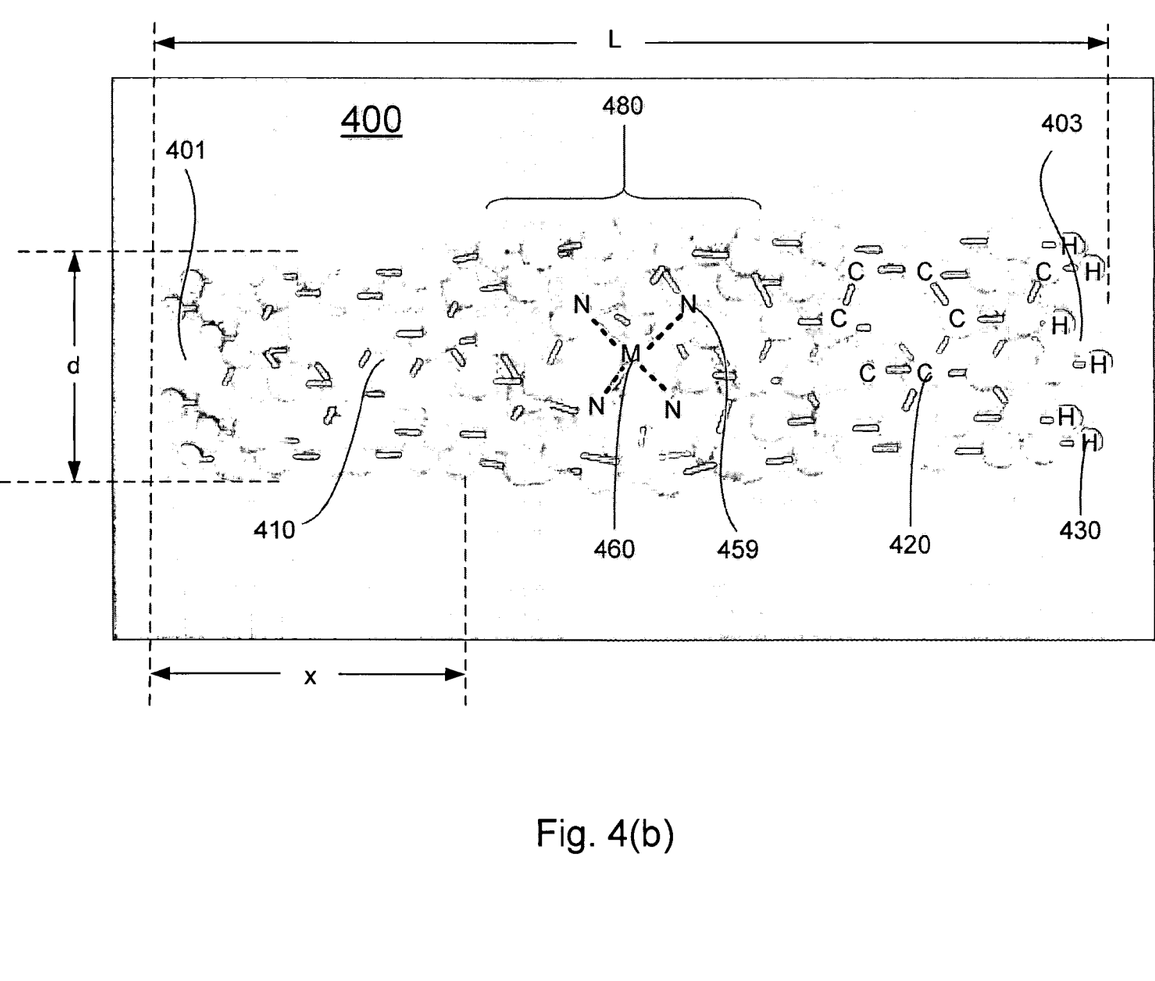
Figure 5:
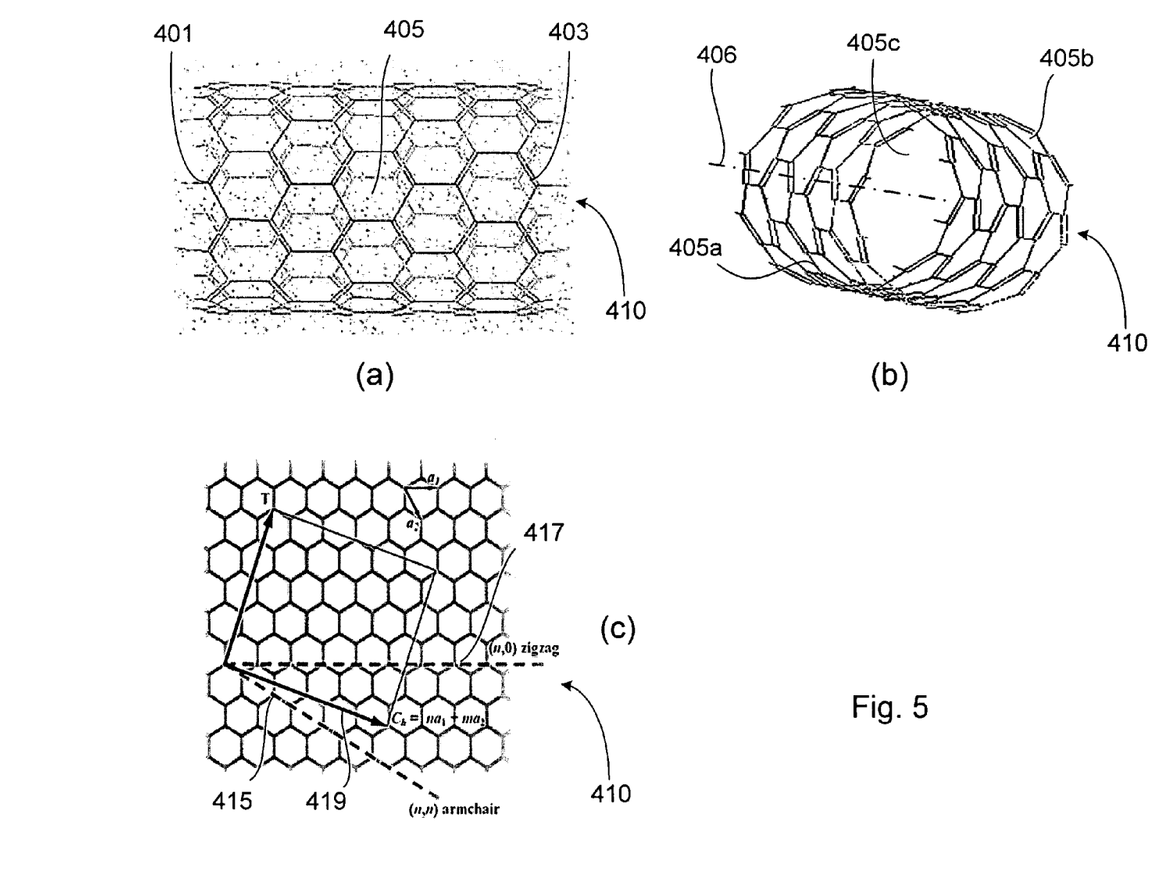
Figure 6:
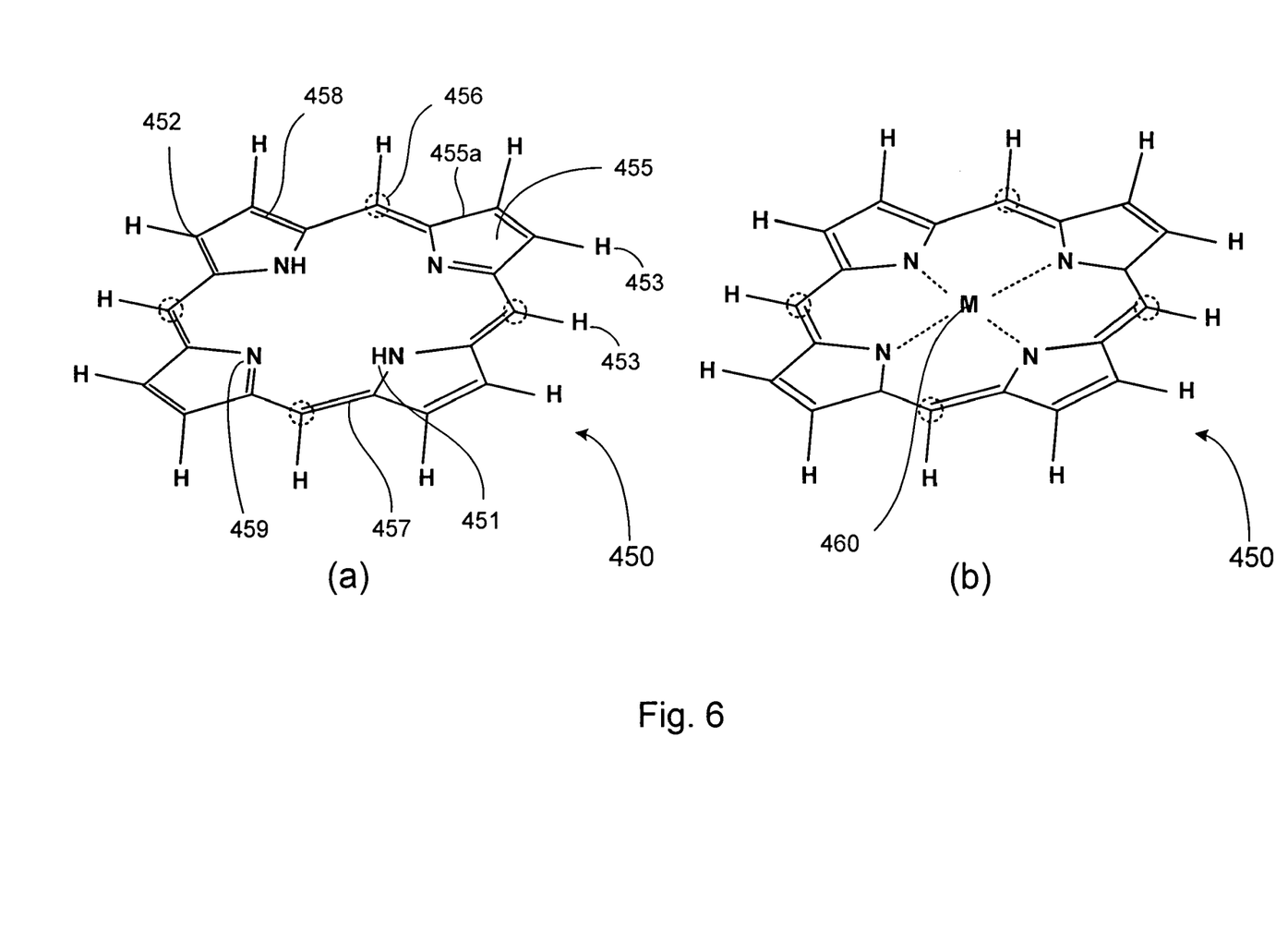

Referring in general to FIGS. 4-6, and in particular to FIG. 4, a molecular structure 400 is shown according to one embodiment of the present invention. In this exemplary embodiment, the molecular structure 400 includes a nanotube 410 and a porphyrin molecule 450 that is chemically coupled with the nanotube 410.

In one embodiment, the nanotube 410 is formed with a plurality of carbon atoms 420 and has a first end 401, an opposite, second end 403, and a body portion 405 defined therebetween. Each carbon atom 420 at the first end 401 and the second end 403 is chemically coupled with a corresponding hydrogen atom 430. The body portion 405 is formed with a carbon wall and has an interior surface 405a defining a cavity 405c, an opposite, exterior surface 405b and a longitudinal axis 406 therethrough the cavity 405c.

The nanotube can be either a single-wall nanotube or a multiwall nanotube. In the exemplary embodiment, as shown in FIGS. 4 and 5, the nanotube 410 is a single-wall nanotube. The nanotube 410 also can be either a conducting nanotube or a semiconducting nanotube. Electronic properties of the nanotube 410 vary with its size and chirality, etc. For a single-wall nanotube 410, its structure can be conceptualized by wrapping a one-atom-thick layer of graphite, so called graphene, into a seamless cylinder, as shown in FIG. 5b. The way the graphene sheet is wrapped is represented by a pair of indices (n, m) called the chiral vector, where n and m are integers, as indicated in FIG. 5c. The integers n and m denote the number of unit vectors along two directions in the honeycomb lattice of graphene, which represent the number of carbon atoms around the circumference of the nanotube and the number of carbon atoms down the nanotube axis 406, respectively. If m=0, the nanotubes are called "zigzag" 417. If n=m, the nanotubes are called "armchair" 415. Otherwise, they are called "chiral" 419. Due to the symmetry and unique electronic structure of graphene, the structure of a nanotube strongly affects its electrical properties. For example, for a given (n,m) nanotube, if 2n+m=3q, where q is an integer, the nanotube is metallic, otherwise the nanotube is a semiconductor. Thus all armchair (n=m) nanotubes 415 are metallic. While (5,0), (6,4), (9,1) nanotubes, etc. are semiconducting. Theoretically, metallic nanotubes can have an electrical current density more than 1,000 times stronger than metals such as silver and copper.

In one embodiment, the porphyrin molecule 450 has a plurality of carbon atoms 452 and a first plurality of hydrogen atoms 451. As shown in FIG. 6, at its original state the porphyrin molecule 450 has four pyrrole units 455. Each pyrrole unit 455 has a five-membered ring 455a with the formula $C_4H_5N$ and is coupled to another pyrrole unit 455 through a methine bridge 456 so as to form a ring structure 457 with a second plurality of hydrogen atoms 453 positioned peripherally along the ring structure 457. Each of the second plurality of hydrogen atoms 453 can be replaced to form a covalent bond with an atom or atoms of another molecule. In one embodiment, the number of the second plurality of hydrogen atoms 453 is not smaller than the number of the first plurality of hydrogen atoms 451. The porphyrin molecule 450 also has four pyrrole nitrogens 459 positioned interiorly on the ring structure 457, as shown in FIG. 6.

The porphyrin molecule 450 is an aromatic system containing eleven double bonds 458. Each double bond 458 contributes two π electrons. Out of the twenty two π electrons, only eighteen of them are involve in any one delocalization pathway, which obey Hueckel's rule of aromaticity with 18=4n+2 π electrons, where n=2. Because of the delocalization of π electrons, the porphyrin molecule 450 has been shown by X-ray crystallography to be planar.

In one embodiment, the porphyrin molecule 450 is in a free base state in which no metal ion is presented inside the ring structure 457, as shown in FIG. 6a. In another embodiment, the porphyrin molecule 450 is in a state in which a metal ion 460, M, is presented inside the ring structure 457 and coordinates with the four pyrrole nitrogens 459, as shown in FIG. 6b. In one embodiment, the metal ion 460 includes an element ranging from an element with atomic number 3 (Li) to an element with atomic number 85 (At), excluding elements in VIIIA (noble gases) of the periodic table. When the porphyrin molecule 540 absorbs light, the metal ion 460 is capable of donating an electron, therefore, starting a cascade of electronic events.

In one embodiment, the porphyrin molecule 450 is chemically coupled to the interior surface 405a of the nanotube 410 such that at least one of the second plurality of hydrogen atoms 453 positioned peripherally along the ring structure 457 is replaced by a carbon atom 420 of the nanotube 410 to form a nanotube-porphyrin molecular structure 400, as shown in FIG. 4. In one embodiment, the carbon atom 420 of the nanotube 410 forms a covalent bond with a corresponding carbon atom 451 of the porphyrin molecule 450. Other bonding methods, such as a non-covalent bond, to anchor the porphyrin molecule 450 to the nanotube 410, may also be utilized to practice the present invention.

The nanotube-porphyrin molecular structure 400 has a length, L, and a diameter, d. In one embodiment, a length L is defined between a first end 401 and a second end 403 of the nanotube 410 along the longitudinal axis 406 of the nanotube 410 and a diameter d is the diameter of the nanotube 410. The diameter d may be varied along the longitudinal axis 406 of the nanotube 410, i.e., d is a function of x, x being a distance measured from the first end 401 or the second end 403 of the nanotube 410. In the exemplary embodiment, as shown in FIG. 4, x is measured from the first end 401 of the nanotube 410. As shown in FIG. 4, in the nanotube-porphyrin molecule 400, the region 480 in which the porphyrin molecule 450 is attached is slightly bigger in diameter than the rest of the nanotube-porphyrin molecule 400, where the structure of the nanotube with carbon wall 1060 and end hydrogen atoms 1020 is relatively intact. The nanotube-porphyrin molecular structure 400 also has a plurality of hydrogen atoms 430 at the first end 401 and the second end 403 of the nanotube 410, respectively.

In one aspect, the present invention relates to a process of synthesizing a nanotube-porphyrin molecular structure. In one embodiment, the process includes the steps of forming a nanotube with a plurality of carbon atoms having an interior surface defining a cavity, an opposite, exterior surface and a longitudinal axis therethrough the cavity, and chemically coupling a porphyrin molecule having a plurality of carbon atoms and a first plurality of hydrogen atoms to the interior surface of the nanotube, wherein at its original state the porphyrin molecule has a plurality of pyrrole units and each pyrrole unit is coupled to another pyrrole unit through a methine bridge so as to form a ring structure with a second plurality of hydrogen atoms positioned peripherally along the ring structure, and wherein the porphyrin molecule is coupled such that at least one of the second plurality of hydrogen atoms is replaced by a carbon atom of the nanotube. In one embodiment, the carbon atom of the nanotube forms a covalent bond with a corresponding carbon atom of the porphyrin molecule.

Other methods of attaching the porphyrin molecule 450 to the nanotube 410 can also be utilized to practice the present invention. For example, a spray dryer having a feed pump, rotary or nozzle atomizer, air heater, air disperser, drying chamber, exhaust air cleaning and powder recovery systems provides the ability to control the material form through the spray drying process. In this process, the porphyrin molecules are atomized with the atomizer and sprayed into the reaction chamber where the nanotubes are being produced to create the nanotube-porphyrin compound disclosed in the present application.

Chemosynthesis represents an alternative method to synthesize the nanotube-porphyrin molecular structure. Chemical self assembly is a form of chemosynthesis. Chemical self assembly is the spontaneous orientation of a number of molecules. It usually occurs in non-covalent bonding among molecules. One advantage of this method is the error correction process. It corrects the wrong type of molecules, and wrong positioned molecules in the assembly process.

Other methods for contacting molecules to create the nanotube-porphyrin molecular structure include scanning tunneling microscopy, conducting atomic force microscopy, break junctions, fixed gap nanojunctions, nanopores, mercury drop contacts and crosswire assemblies.

The nanotube-porphyrin molecule, as disclosed above, among other things, can find many applications in electronic device systems.

In one aspect, the present invention relates to a logic gate for use in an electronic circuit. In one embodiment, the logic gate has a plurality of nanotube-porphyrin molecular structures forming an array that is capable of performing a logical operation responsive to a signal. The logical operation includes an AND operation, an OR operation, a NOT operation, or a combination thereof. In one embodiment, the signal comprises a signal related to one of an electric field, a magnetic field, an electromagnetic field, and a combination thereof. For examples, the signal can be an electronic signal or a photonic signal.

An alternative embodiment of the present invention provides a photovoltaic device for producing an electronic signal when exposed to a radiant energy. In this embodiment, the photovoltaic device includes a plurality of nanotube-porphyrin molecular structures forming an array that is capable of producing an electronic signal responsive to the radiant energy, and a processor coupled to the array of the plurality of nanotube-porphyrin molecular structures for outputting the produced electronic signal. The output electronic signal is in the form of one of voltage and current. In one embodiment, the radiant energy comprises photons.

In brief, the present invention, among other unique features, discloses a nanotubes-porphyrin molecular structure that is capable of performing logic functions responsive to a signal, and therefore can be used as a basic component in electronic device systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A molecular structure, comprising:
   a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and wherein the nanotube has a graphene structure; and
   a porphyrin molecule having a plurality of carbon atoms and a first plurality of hydrogen atoms, wherein the porphyrin molecule has a plurality of pyrrole units and each pyrrole unit is coupled to another pyrrole unit through a methine bridge so as to form a ring structure with a second plurality of hydrogen atoms positioned peripherally along the ring structure, wherein the porphyrin molecule is chemically coupled to the interior surface of the nanotube such that at least one of the second plurality of hydrogen atoms positioned peripherally along the ring structure is replaced by a carbon atom of the nanotube, and wherein the porphyrin molecule further has a plurality of pyrrole nitrogens positioned interiorly on the ring structure and coordinated to a metal ion.

2. The molecular structure of claim 1, wherein the carbon atom of the nanotube is covalently bonded with a corresponding carbon atom of the porphyrin molecule.

3. The molecular structure of claim 1, wherein the nanotube comprises one of a conducting nanotube and a semiconducting nanotube.

4. The molecular structure of claim 3, wherein the nanotube comprises a single wall nanotube.

5. The molecular structure of claim 3, wherein the nanotube comprises a multiwall nanotube.

6. The molecular structure of claim 1, wherein the metal ion comprises an element ranging from an element with atomic number 3 (Li) to an element with atomic number 85 (At), excluding elements in VIIIA of the periodic table.

7. The molecular structure of claim 1, wherein the metal ion comprises zinc.

8. The molecular structure of claim 1, wherein the number of the second plurality of hydrogen atoms is not smaller than the number of the first plurality of hydrogen atoms.

9. The molecular structure of claim 1, wherein at least one of the second plurality of hydrogen atoms positioned peripherally along the ring structure of the porphyrin molecule is replaced by a carbon atom of the graphene structure of the nanotube.

10. A process of synthesizing a nanotube-porphyrin molecular structure, comprising the steps of:
   a. forming a nanotube with a plurality of carbon atoms having a first end, an opposite, second end, and a body portion defined therebetween, wherein the body portion has an interior surface defining a cavity, an opposite, exterior surface and a longitudinal axis therethrough the cavity, and wherein the nanotube has a graphene structure; and b. chemically coupling a porphyrin molecule having a plurality of carbon atoms and a first plurality of hydrogen atoms to the interior surface of the nanotube, wherein the porphyrin molecule has a plurality of pyrrole units and each pyrrole unit is coupled to another pyrrole unit through a methine bridge so as to form a ring structure with a second plurality of hydrogen atoms positioned peripherally along the ring structure, and wherein the porphyrin molecule is coupled such that at least one of the second plurality of hydrogen atoms is replaced by a carbon atom of the nanotube, wherein the porphyrin molecule further has a plurality of pyrrole nitrogens positioned interiorly on the ring structure and coordinated to a metal ion.

11. The process of claim 10, wherein the carbon atom of the nanotube is covalently bonded with a corresponding carbon atom of the porphyrin molecule.

12. The process of claim 10, wherein the nanotube comprises one of a conducting nanotube and a semiconducting nanotube.

13. The process of claim 12, wherein the nanotube comprises a single wall nanotube.

14. The process of claim 12, wherein the nanotube comprises a multiwall nanotube.

15. The process of claim 10, wherein the metal ion comprises an element ranging from an element with atomic number 3 (Li) to an element with atomic number 85 (At), excluding elements in VIII A of the periodic table.

16. A logic gate for use in an electronic circuit, comprising a plurality of nanotube-porphyrin molecular structures forming an array that is capable of performing a logical operation responsive to a signal, wherein each nanotube-porphyrin molecular structure comprises
   (i). a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and wherein the nanotube has a graphene structure; and
   (ii). a porphyrin molecule having a plurality of carbon atoms and a first plurality of hydrogen atoms, wherein the porphyrin molecule has a plurality of pyrrole units and each pyrrole unit is coupled to another pyrrole unit through a methine bridge so as to form a ring structure with a second plurality of hydrogen atoms positioned peripherally along the ring structure, wherein the porphyrin molecule is chemically coupled to the interior surface of the nanotube such that at least one of the second plurality of hydrogen atoms positioned peripherally along the ring structure is replaced by a carbon atom of the nanotube, and wherein the porphyrin molecule further has a plurality of pyrrole nitrogens positioned interiorly on the ring structure and coordinated to a metal ion.

17. The logic gate of claim 16, wherein the carbon atom of the nanotube forms a covalent bond with a corresponding carbon atom of the porphyrin molecule.

18. A photovoltaic device for producing an electronic signal when exposed to a radiant energy, comprising:
   a. a plurality of nanotube-porphyrin molecular structures forming an array that is capable of producing an electronic signal responsive to the radiant energy; and
   b. a processor coupled to the array of the plurality of nanotube-porphyrin molecular structures for outputting the produced electronic signal, wherein each nanotube-porphyrin molecular structure comprises
      (i). a nanotube formed with a plurality of carbon atoms having a first end, an opposite, second end, and a body portion defined therebetween, wherein the body portion has an interior surface defining a cavity, an opposite, exterior surface and a longitudinal axis therethrough the cavity, and wherein the nanotube has a graphene structure; and
      (ii). a porphyrin molecule having a plurality of carbon atoms and a first plurality of hydrogen atoms, wherein the porphyrin molecule has a plurality of pyrrole units and each pyrrole unit is coupled to another pyrrole unit through a methine bridge so as to form a ring structure with a second plurality of hydrogen atoms positioned peripherally along the ring structure,
      wherein the porphyrin molecule is chemically coupled to the interior surface of the nanotube such that at least one of the second plurality of hydrogen atoms positioned peripherally along the ring structure is replaced by a carbon atom of the nanotube.

19. The photovoltaic device of claim 18, wherein the carbon atom of the nanotube is covalently bonded with a corresponding carbon atom of the porphyrin molecule.

* * * * *